United States Patent
Deyda et al.

(10) Patent No.: US 9,586,481 B2
(45) Date of Patent: Mar. 7, 2017

(54) DEVICE, VEHICLE, METHOD AND COMPUTER PROGRAM FOR DEACTIVATING HIGH-VOLTAGE COMPONENTS OF A VEHICLE

(71) Applicant: VOLKSWAGEN AG, Wolfsburg (DE)

(72) Inventors: Andreas Deyda, Erkerode (DE); Rainer Kröger, Wasbüttel (DE); Matthias Ullrich, Gifhorn (DE)

(73) Assignee: Volkswagen AG, Wolfsburg (DE)

( * ) Notice: Subject to any disclaimer, the term of this patent is extended or adjusted under 35 U.S.C. 154(b) by 0 days.

(21) Appl. No.: 14/428,404

(22) PCT Filed: Aug. 14, 2013

(86) PCT No.: PCT/EP2013/066987
§ 371 (c)(1),
(2) Date: Mar. 16, 2015

(87) PCT Pub. No.: WO2014/040814
PCT Pub. Date: Mar. 20, 2014

(65) Prior Publication Data
US 2015/0224881 A1    Aug. 13, 2015

(30) Foreign Application Priority Data

Sep. 17, 2012   (DE) .................. 10 2012 018 338

(51) Int. Cl.
*G01M 17/00*    (2006.01)
*G06F 7/00*    (2006.01)
(Continued)

(52) U.S. Cl.
CPC .............. *B60L 3/04* (2013.01); *B60L 3/0007* (2013.01); *B60L 3/0015* (2013.01);
(Continued)

(58) Field of Classification Search
CPC .......... B60K 8/00; G07C 5/008; F16B 39/00; G06F 17/00
(Continued)

(56) References Cited

U.S. PATENT DOCUMENTS 5,238,083 A * 8/1993 Horie .................... B60L 3/0007
                                                    180/274
2004/0213644 A1* 10/2004 Clark et al. ............. F16B 39/00
                                                    411/107
(Continued)

FOREIGN PATENT DOCUMENTS

DE    102004057828 A1    6/2006
DE    102005036174 A1    2/2007
(Continued)

OTHER PUBLICATIONS

English Translation for WO2011/095630.*
Search Report for German Patent Application No. 10 2012 018 338.0; Feb. 27, 2013.
(Continued)

*Primary Examiner* — Jelani Smith
*Assistant Examiner* — Mahmoud Ismail
(74) *Attorney, Agent, or Firm* — Barnes & Thornburg LLP (57) ABSTRACT

A device, vehicle, method and computer program for deactivating high-voltage components of a vehicle. The device for deactivating high-voltage components of a vehicle carries out an error analysis of the high-voltage components after detecting a vibration and deactivates the high-voltage components if an error in the high-voltage components results in the error analysis.

11 Claims, 3 Drawing Sheets

(51) Int. Cl.
| | |
|---|---|
| *G06F 11/30* | (2006.01) |
| *G06F 19/00* | (2011.01) |
| *G07C 5/00* | (2006.01) |
| *G01R 31/00* | (2006.01) |
| *B60L 3/04* | (2006.01) |
| *B60L 3/00* | (2006.01) |
| *B60R 21/01* | (2006.01) |
| *B60L 3/12* | (2006.01) |
| *G01H 17/00* | (2006.01) |
| *G05D 1/00* | (2006.01) |
| *G05D 3/00* | (2006.01) |
| *G06F 17/00* | (2006.01) |
| *H02P 1/00* | (2006.01) |

(52) U.S. Cl.
CPC ............... *B60L 3/0069* (2013.01); *B60L 3/12* (2013.01); *B60R 21/01* (2013.01); *G01H 17/00* (2013.01); *G01R 31/006* (2013.01); *B60R 2021/01252* (2013.01); *G06F 17/00* (2013.01); *Y10S 903/904* (2013.01)

(58) Field of Classification Search
USPC ................. 701/1, 29, 12; 324/503; 318/139
See application file for complete search history.

(56) References Cited

U.S. PATENT DOCUMENTS

| | | | |
|---|---|---|---|
| 2006/0149427 A1* | 7/2006 | Evans | ................. G01R 31/025 701/1 |
| 2007/0114077 A1* | 5/2007 | Goetz | ..................... B60K 6/48 180/54.1 |
| 2009/0121544 A1* | 5/2009 | Bailey | ................. B60L 11/1816 307/10.1 |
| 2011/0148428 A1* | 6/2011 | Lasson | .................. G01R 27/18 324/503 |

FOREIGN PATENT DOCUMENTS

| | | | | |
|---|---|---|---|---|
| DE | 102008043909 A1 | 5/2010 | | |
| DE | 102009027072 A1 | 12/2010 | | |
| DE | 102010005203 A1 | 7/2011 | | |
| WO | WO 2010050858 A | * 5/2010 | | |
| WO | WO 2011095630 A1 | * 8/2011 | ........ H01M 10/4207 |

OTHER PUBLICATIONS

Search Report for International Patent Application No. PCT/EP2013/066987; Apr. 17, 2014.
Chinese Office Action for Chinese Application 201380060189.7 dated Apr. 5, 2016.

* cited by examiner

DEVICE, VEHICLE, METHOD AND COMPUTER PROGRAM FOR DEACTIVATING HIGH-VOLTAGE COMPONENTS OF A VEHICLE

PRIORITY CLAIM

This patent application is a U.S. National Phase of International Patent Application No. PCT/EP2013/066987, filed 14 Aug. 2013, which claims priority to German Patent Application No. 10 2012 018 338.0, filed 17 Sep. 2012, the disclosures of which are incorporated herein by reference in their entirety.

SUMMARY

Illustrative embodiments relate to the field of hybrid or electronic vehicles, in particular the deactivation of high-voltage components of such vehicles.

BRIEF DESCRIPTION OF THE DRAWINGS

Exemplary embodiments are now described in more detail using the accompanying figures, in which.

DETAILED DESCRIPTION OF THE DISCLOSED EMBODIMENTS

Exemplary embodiments are based on the knowledge that, in the event of an accident involving a motor vehicle, it may be quite desirable for the high-voltage components not to be disconnected. On the one hand, it is inevitable that the high-voltage components will be disconnected as quickly as possible in the event of damage or a major accident involving a vehicle. On the other hand, however, for example in more minor accidents, it may be desirable for the vehicle to remain mobile, with the result that a hazardous area, for example, can be left as quickly as possible. In this respect, exemplary embodiments are also based on the knowledge that, following a slight vibration or slight damage, maintaining the mobility of the vehicle may be more important than disconnecting the high-voltage components provided that the latter are functional and there is no imminent danger.

Exemplary embodiments are also based on the knowledge that, after a detected vibration, as may occur in accidents for example, a fault analysis can first of all be carried out on the high-voltage system. The result of the fault analysis can then be used to decide whether or not the high-voltage components need to be disconnected. Exemplary embodiments can therefore provide the advantage that, in the event of an accident in which the high-voltage components and the high-voltage system are not damaged, the mobility of the motor vehicle can be immediately maintained, with the result that it is possible to leave the hazardous area using the vehicle.

In other words, exemplary embodiments may provide for an intelligent query of on-board diagnosis to be able to be started if an accident is detected or pre-detected (also "pre-crash detection" or "crash detection"). On-board means of the vehicle may be used to diagnose the system. In this case, provision may be made for the diagnosis to be initiated immediately after the vibration has been detected and not only at regular intervals of time, for example every 30 seconds. Exemplary embodiments may therefore provide the advantage that faults are detected earlier since the starting-up or starting of an on-board diagnostic system, for example after an ignition change (switching-off and switching-on again at the ignition lock), takes considerably more time than an immediate diagnosis. In other words, exemplary embodiments can save valuable time by virtue of the high-voltage system and a relevant diagnostic system or fault analysis being able to be started immediately after the vibration has been detected. Exemplary embodiments therefore need not wait for an ignition change to take place, that is to say switching-off of the ignition and subsequent switching-on of the ignition again. In the hazardous situation, the driver can therefore also immediately move the vehicle if necessary without having to restart it first.

In this respect, exemplary embodiments may result in the advantage that time can be saved in comparison with disconnection in the event of a minor accident, which is also called a low-speed crash, since the self-diagnosis is not started only after a new ignition change. This is also understood as reversible disconnection in which, although the components are disconnected, they can be switched on again by an ignition change. In the case of accidents with a low crash severity (for example low-speed crash at <40 km/h), such reversible disconnection results in the vehicle being able to be rendered mobile again only after a certain time.

Exemplary embodiments therefore provide a device for deactivating high-voltage components of a vehicle, the device being designed to carry out a fault analysis of the high-voltage components following the detection of a vibration and to disconnect the high-voltage components if the fault analysis reveals a fault in the high-voltage components. In other words, the device can be used in a vehicle, for example in a control device or in a high-voltage coordinator. The device is designed to deactivate the high-voltage components of the vehicle. In this case, exemplary embodiments may provide for a fault analysis to first of all be carried out on the high-voltage components before they are deactivated. Exemplary embodiments can therefore provide the advantage that the mobility of the vehicle can be retained if no faults are found in the high-voltage components.

In exemplary embodiments, the device may also be designed to initiate a self-diagnosis of one or more of the high-voltage components as part of the fault analysis. In addition, an interlock check can be initiated, for example. In other words, a so-called interlock system may be provided in exemplary embodiments. The interlock system is a system which is implemented in addition to the high-voltage system to monitor all contacts, for example connectors or plug connections, distributors, etc. of the high-voltage system. In this case, the interlock system is implemented using one or more lines which run in a parallel manner at least at the connectors or connections of the high-voltage system. A connector of the high-voltage system can then be released only by previously releasing the loop or contact of the interlock system. An interruption in the interlock system then signals an imminent interruption in the high-voltage system.

In the case of such an interruption, exemplary embodiments may provide for the high-voltage system to likewise be interrupted. The interlock system is known in the conventional field and is used to increase the occupational safety in such vehicles. In other words, the high-voltage system cannot be disconnected in the normal situation without previously disconnecting the interlock system. This achieves greater safety for mechanics working on these vehicles. In other words, the interlock system provides for a leading signal contact to be interrupted if a live plug connector is intended to be opened. The contacts of the interlock system are arranged in such a manner that they are always opened first before the contacts of the high-voltage system. Based on this information, the main current path, that is to say that of the high-voltage system, can then be interrupted in good time and can be switched to the voltage-free state before the main contacts are actually disconnected.

Exemplary embodiments may therefore provide for the interlock system to be checked as part of the fault analysis or fault diagnosis. In addition, a line interruption can be detected and/or an insulation resistance measurement can be initiated on the components of the high-voltage system. This can be carried out, for example, by means of a high-voltage battery which is equipped with the components required for this purpose. In exemplary embodiments, the device can then transmit a corresponding signal to the high-voltage battery to initiate the insulation resistance measurement. In addition, a voltage status of a high-voltage heating system and/or of an electrical air-conditioning compressor may be checked. In exemplary embodiments, the high-voltage heating system may be checked, for example, by briefly switching it on. After the high-voltage heating system has been switched on, its voltage status or power consumption, for example, can be determined using the flow of current, for example. In exemplary embodiments, further components of the high-voltage system are conceivable. Exemplary embodiments may provide for these components to be checked as part of the fault analysis before the decision to disconnect the high-voltage components is made.

In some exemplary embodiments, the device may be designed to irreversibly disconnect the high-voltage components. In other words, the high-voltage components are disconnected in such a manner that they cannot be activated again even by switching off the ignition and then switching the ignition on again. This may be helpful, in particular, in the case of relatively great damage to the components since hazards may no longer emanate from these components even after the attempt is made to restart the vehicle. Any short circuits or contacts between the live high-voltage components and a housing or the body of the vehicle, for example, then no longer have an effect as the high-voltage components have been irreversibly disconnected.

In further exemplary embodiments, the device may be designed to initiate an active discharge of one or more high-voltage capacitors in the event of irreversible disconnection. In exemplary embodiments, the high-voltage capacitors may be included in power electronics, for example. Generally, high-voltage capacitors may occur at many locations and in many components of a high-voltage system. In other words, the device may ensure that the energy remaining in the high-voltage capacitors is discharged in a controlled and rapid manner after disconnection has been carried out. Exemplary embodiments can therefore provide the advantage that the potential hazard emanating from a charged high-voltage capacitor can be curbed after damage by discharging the high-voltage capacitor in a rapid and controlled manner. In exemplary embodiments, a corresponding high-voltage battery can then be simultaneously disconnected from the high-voltage network. In some exemplary embodiments, the energy additionally stored in capacitors in the high-voltage network is thus discharged in a controlled manner. The battery is disconnected from the network and the network is discharged. In further exemplary embodiments, the device may be designed to distinguish a minor accident from a major accident if the vibration is detected. In other words, a certain sensor system may be provided which allows a major accident to be distinguished from a minor accident. For example, it is possible to use acceleration sensors or vibration sensors here, the output signal from which provides information relating to how serious an impact, a jerk, a vibration, etc. was. The device may also be designed to irreversibly and directly disconnect the high-voltage components without a fault analysis in the event of a major accident. In other words, exemplary embodiments may provide the advantage that, when a major vibration, in particular a major accident, is detected, the high-voltage components are directly disconnected, with the result that a hazard can no longer emanate from them. In addition, the device may be designed to first carry out the fault analysis in the event of a minor accident and to disconnect the high-voltage components if the fault analysis reveals a fault in the high-voltage components. In this respect, exemplary embodiments may provide the advantage that there is the chance to retain the mobility of the vehicle in the event of a minor accident. In this respect, the device may be designed to keep the high-voltage components ready for operation, in other words not to disconnect them, in the event of a minor accident and if the fault analysis reveals a fault-free function of the high-voltage component.

In some exemplary embodiments, the device may also be designed to reversibly disconnect the high-voltage components in the event of a minor accident and if the fault analysis reveals a fault in the high-voltage components. Such exemplary embodiments may provide the advantage that there is the option of possibly eliminating the fault after a minor accident, with the result that the mobility of the vehicle can then be restored without the vehicle remaining motionless. In addition, exemplary embodiments may also provide for reversible disconnection to first of all be carried out and for irreversible disconnection to be carried out during renewed fault detection after being switched on again to provide at least an option of simple fault removal in situ. In other exemplary embodiments, the device can also be designed to carry out irreversible disconnection after a certain number of successive faults, for example 3 or 5.

In other exemplary embodiments, the device may be designed to detect the vibration using an airbag sensor. In other words, vehicles with an airbag already provide a sensor which detects vibrations. In this case, the airbag sensor may be designed to quantize the vibrations, that is to say to indicate or signal a plurality of levels of vibrations. For example, it is possible to indicate slight vibrations which, although they do not result in the airbag being triggered, are nevertheless detected by the sensor. For example, such a signal, that is to say such a slight vibration, can be used to initiate the fault analysis. In other words, a vibration can be detected on the basis of the signal from an airbag sensor in exemplary embodiments. Such a slight vibration or a minor accident can be detected when the airbag sensor indicates a vibration but this does not result in the airbag being triggered. In this respect, exemplary embodiments may also provide the advantage that the connection and disconnection of the high-voltage components are not tied to the triggering of an airbag. Exemplary embodiments may therefore be independent of the triggering of an airbag.

In further exemplary embodiments, the device may be designed to provide a predefined period for the fault analysis. For example, it is possible to provide a window of 1, 2, 3, 5, 10 or 20 seconds, inside which the fault analysis or diagnosis must be concluded before disconnection is carried out. The device may also be designed to disconnect the high-voltage components if the fault analysis has not been concluded by the expiry of the predefined time. This has the advantage that the fault analysis or diagnosis cannot take an arbitrary amount of time and the high-voltage components can therefore be reliably disconnected for the sake of safety after a short period, for example 3 seconds.

Exemplary embodiments also provide a vehicle having a device described above. In such exemplary embodiments, the vehicle may have, as high-voltage components, a high-voltage battery, an electrical drive, power electronics, one or more high-voltage capacitors, a charging device, a high-voltage heating system and/or a high-voltage air-conditioning compressor, for example. These components can then possibly be coupled in pairs or else to one another, with the result that the device may carry out a corresponding fault analysis by interchanging corresponding signals. In some exemplary embodiments, these high-voltage components may communicate with one another using a bus, that is to say a data bus, for example. The CAN bus (Controller Area Network) can be used in this case, for example. As already mentioned above, in exemplary embodiments, the vehicle may comprise an airbag sensor which may be coupled to the device. In addition, the vehicle may also comprise a high-voltage contactor which connects the high-voltage battery to the rest of the high-voltage system, for example. The device may then likewise be coupled to the high-voltage contactor, the high-voltage contactor making it possible to disconnect the high-voltage components. In other words, in such exemplary embodiments, the device may be designed to transmit a signal to the high-voltage contactor, with the result that the latter deactivates the high-voltage components.

Exemplary embodiments also provide a method for deactivating high-voltage components of a vehicle. The method comprises detection of a vibration and performance of a fault analysis of the high-voltage components. The method also comprises disconnection of the high-voltage components if the fault analysis reveals a fault in the high-voltage components.

Exemplary embodiments also provide a computer program having a program code for carrying out one of the methods described above when the program code is executed on a computer, a processor or a programmable hardware component. Such a computer program may be executed, for example, in a control device or a high-voltage coordinator.

In the following description of the accompanying figures which show exemplary embodiments, identical reference symbols denote identical or comparable components. Furthermore, summarizing reference symbols are used for components and objects which occur repeatedly in an exemplary embodiment or in a drawing but are described together in terms of one or more features. Components or objects which are described with identical or summarizing reference symbols may have the same but possibly also a different design in terms of individual, a plurality of or all features, for example their dimensioning, if not explicitly or implicitly revealed otherwise in the description.

It is explicitly pointed out that further exemplary embodiments are not intended to be restricted by the specific implementations shown in the following figures. In particular, the fact that particular functionalities are described in the following figures with respect to specific entities, specific function blocks or specific devices is not intended to be interpreted such that these functionalities are intended or even have to be distributed in the same manner in further exemplary embodiments. In further exemplary embodiments, particular functionalities subsequently assigned to separate components or units may be combined in a single component or in a single functional element or may be carried out herein, as functionalities combined in a single element, in separate functional units or by a plurality of separate components.

It is also pointed out that, if a specific element or component is referred to as being connected, coupled or linked to another element, this does not necessarily mean that the element or component is intended to be immediately and directly connected, coupled or linked to the other component. If this is intended, it is explicitly pointed out by describing that the element is directly connected, directly coupled or directly linked to the further element. This means that no further elements which are in between and provide an indirect coupling or connection or link are present. In addition, in the following figures, identical reference symbols denote identical, functionally identical or functionally similar components which can therefore be substituted with one another between the different exemplary embodiments described below. Therefore, for the detailed description of such a component which is illustrated in one figure, it is also possible to resort to the description of the corresponding component or structural element in another figure.

Figure 1:
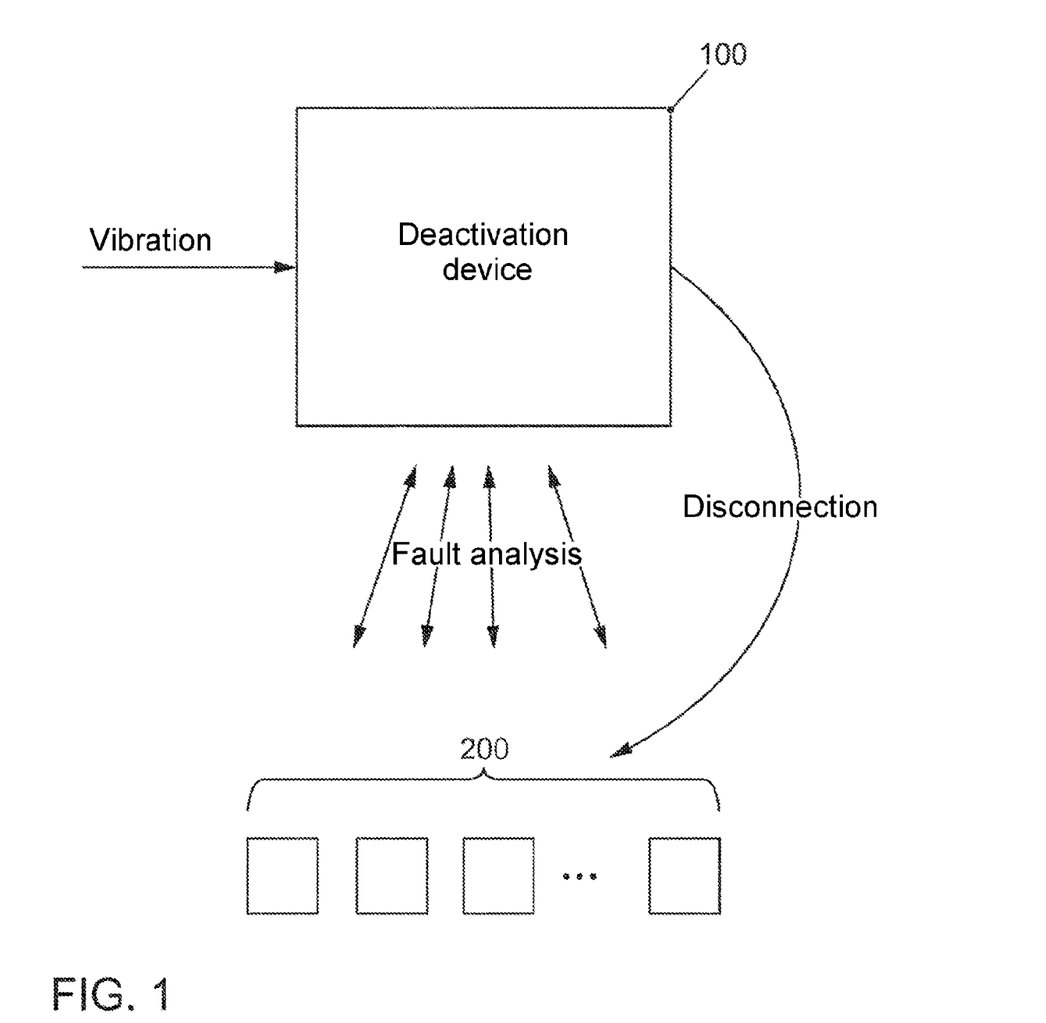
FIG. 1 shows a block diagram of an exemplary embodiment of a device for deactivating the high-voltage components.

FIG. 1 shows an exemplary embodiment of a device 100 for deactivating high-voltage components 200 of a vehicle. The high-voltage components 200 are illustrated in an indeterminate number in a summarizing manner in FIG. 1. The high-voltage components are described in detail below using the further figures. The device 100 is designed to carry out a fault analysis of the high-voltage components following the detection of a vibration and to disconnect the high-voltage components 200 if the fault analysis reveals a fault in the high-voltage components.

Figure 2:
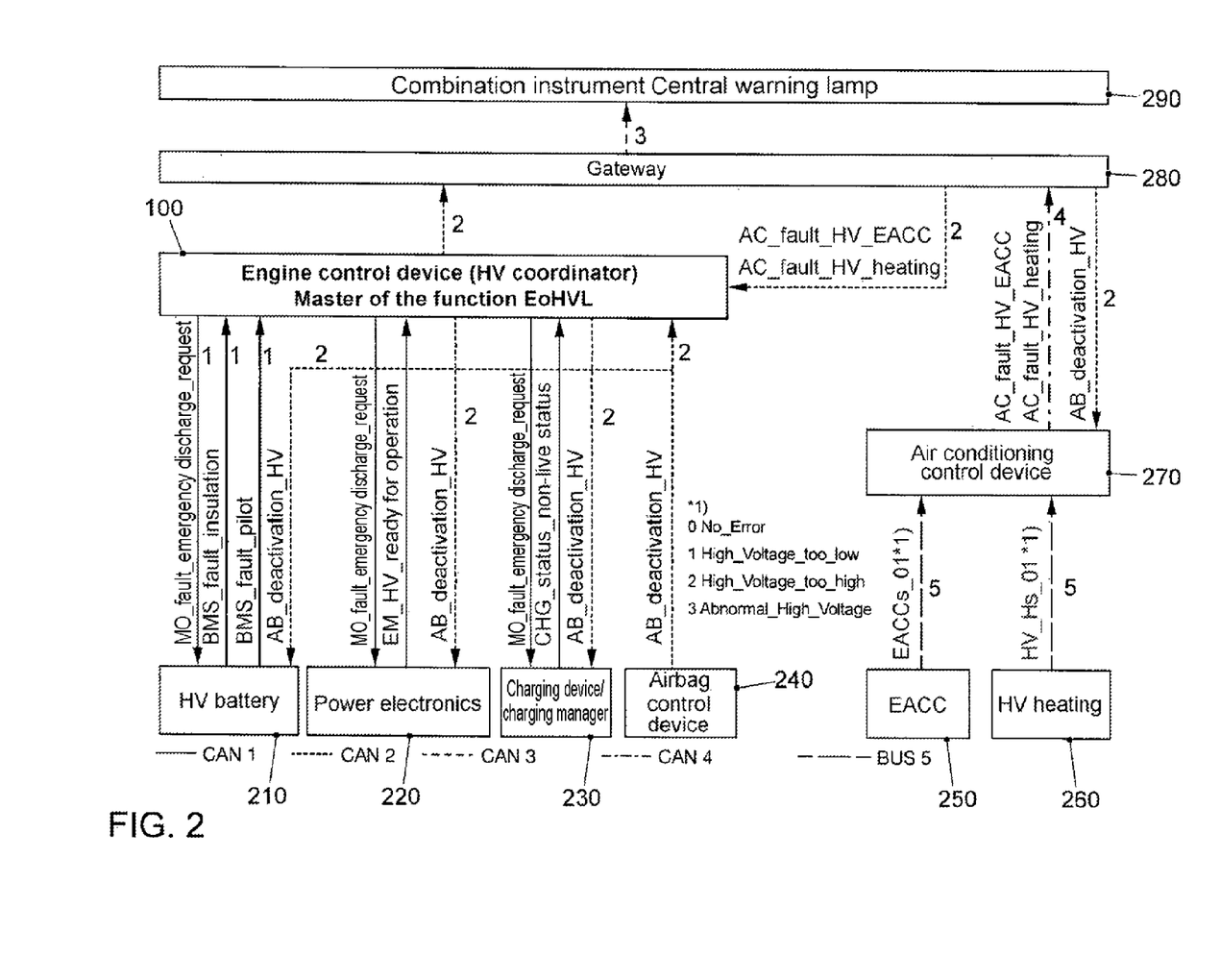
FIG. 2 shows a signal flow diagram of an exemplary embodiment.

FIG. 2 shows a signal flow diagram in an exemplary embodiment. In this case, the device 100 is illustrated as an engine control device (MSG) or a high-voltage coordinator (HV coordinator) 100 and forms the master entity of the function "detection of open high-voltage lines (EoHVL)". As also shown in FIG. 2, different CAN buses or CAN segments which are denoted by "CAN 1", "CAN 2", "CAN 3" and "CAN 4" and by different line styles for the individual connections are used for communication between the individual components. In this case, the CAN segments may directly or indirectly connect individual components. For example, CAN segments may also be routed via an interface 280. In this case, the individual CAN segments may comprise H-CAN segments, for example for communicating with high-voltage components, A-CAN segments, for example for communicating with drive components, combination CAN segments, for example for communicating with a combination instrument, comfort CAN segments, for example for communicating with comfort components, etc. In the exemplary embodiment considered, "CAN 1" is used to communicate with a high-voltage battery 210. "CAN 2" is used for communication between the device 100 and power electronics 220 and an airbag control device 240. "CAN 3" is used to communicate with a combination instrument 290. "CAN 4" is used for communication between an air-conditioning control device 270 and an interface 280. A "BUS 5" which can be implemented by means of a binary connection 5 (LIN, Local Interconnect Network) is used for communication between an electronic air-conditioning compressor 250 and the air-conditioning control device 270 and for communication between a high-voltage heating system 260 and the air-conditioning control device 270. "CAN 2" is also used for communication between the device 100 and the interface 280.

An exemplary embodiment which uses an airbag sensor to detect an accident or crash or the vibration is explained below. In this case, the exemplary embodiment distinguishes whether the crash is below a restraint triggering threshold for seatbelt tensioners, for example. If the intensity of the crash is above the restraint triggering threshold, a serious fault is detected and the high-voltage components are immediately irreversibly disconnected. That is to say, a high-voltage contactor is used to disconnect the high-voltage components, for example the high-voltage battery 210, from the other components. In addition, the power electronics 220 are used to discharge any high-voltage capacitors and possibly to disconnect the high-voltage battery 210 from the high-voltage network. In other words, the device 100 is designed to irreversibly disconnect the high-voltage components 200, 210, 220, 230, 250 and 260. In the exemplary embodiment considered, the device is also designed to detect the vibration, that is to say a crash, using an airbag sensor. The device 100 is also designed to initiate an active discharge of the high-voltage capacitors in the event of irreversible disconnection. The device 100 is also designed to initiate a self-diagnosis of one or more of the high-voltage components 200 as part of the fault analysis. As part of the self-diagnosis or the fault analysis, an interlock check may be carried out, an insulation resistance measurement may be carried out, a line interruption may be detected, or a voltage status of the high-voltage heating system 260 and/or of the electronic air-conditioning compressor 250 may be determined, for example.

The exemplary embodiment checks, in particular, that there are no insulation faults and that all components are supplied with an appropriate voltage. If a fault is found, a warning light is actuated in the combination instrument 290, for example a red lamp or "pull over immediately". The vehicle is then switched off and the high-voltage components are disconnected and locked, that is to say irreversibly deactivated. If no fault is found, the high-voltage components are not deactivated, with the result that the vehicle can move on. In some exemplary embodiments, a yellow lamp, for example, may nevertheless be actuated in the combination instrument 290, for example to indicate "look for a garage, have high-voltage components tested".

In this respect, it is emphasized again that the exemplary embodiment provides the advantage, over reversible disconnection, that the vehicle remains mobile. In the case of reversible disconnection, a corresponding crash below the restraint triggering threshold would also be detected, but the contactor would be opened to deactivate the high-voltage components. The vehicle would then coast; depending on the fault, the driver could attempt to start the vehicle by renewed ignition. A restart would not be possible in the event of a serious fault, and the vehicle would start if there were no fault. After being started, the vehicle would first of all independently carry out a self-diagnosis, the restart being carried out only when there is no insulation fault, in particular, and all components are live. If this is not the case, a corresponding warning light, for example a red lamp or "pull over immediately", could also be actuated here, the vehicle would be switched off and the high-voltage components would be locked, that is to say irreversibly deactivated. If no fault were found, it would be possible to move the vehicle on as desired and a yellow warning lamp could light up in a similar manner to the above example. In this respect, the exemplary embodiment saves the time needed to switch off the vehicle and restart it, including the self-diagnosis time after starting and the further starting processes.

In the exemplary embodiment considered, the device 100 is also designed to distinguish a minor accident from a major accident if the vibration is detected. The device is designed to irreversibly disconnect the high-voltage components 200 without a fault analysis in the event of a major accident and to carry out the fault analysis in the event of a minor accident and to switch off the high-voltage components 200 if the fault analysis reveals a fault in the high-voltage components. In other words, any supply to the high-voltage system is irreversibly deactivated by the high-voltage disconnection functionality in a crash following a crash with a high crash severity. In addition, dangerous voltages are lowered within the legal requirements and renewed start-up is prevented. In the event of a crash with a low crash severity, irreversible disconnection is carried out in the exemplary embodiment considered after a fault has been detected in the high-voltage system. In other exemplary embodiments, only reversible disconnection as already described above can also be carried out.

In the exemplary embodiment considered, the airbag control device 240 monitors the accelerations carried out by the vehicle when the ignition is switched on, that is to say when the terminal 15 is activated, with the result that rollovers and/or an impact can be detected, for example. A plurality of signals are conceivable in this case. In the present case, the CAN crash signal is calculated according to a particular algorithm and is transmitted. In the exemplary embodiment considered, the crash signal is included in three groups: no crash, crash with a low crash severity (below the airbag triggering) and crash with a high crash severity (with airbag triggering). In the case of a crash below the airbag triggering, the high-voltage system is irreversibly deactivated and then actively discharged only if faults are detected. The faults include faults in the high-voltage interlock, insulation faults and/or an open/interrupted high-voltage line. This signaling is ultimately carried out using the CAN bus. In the case of a crash with irreversible high-voltage disconnection, the airbags are triggered, the high-voltage battery 210 is irreversibly deactivated and the high-voltage system is actively discharged. The signaling is carried out using the CAN and a discrete airbag firing line.

In the exemplary embodiment considered, it is also assumed that a high-voltage contactor switches the high-voltage components 200 on and off. Before the high-voltage components 200 are connected via the high-voltage contactor, the high-voltage coordinator 100 and the high-voltage battery 210 check whether a crash fault memory entry has been made for irreversible disconnection in a fault memory. The connection is carried out only if no fault memory entry for irreversible crash disconnection has been made. Depending on the severity of the crash, the airbag control device 240 transmits a signal value of the signal AB_deactivation_HV for a particular time, for example 10 seconds, which signal value is either AB_deactivation_HV=1,
AB_deactivation_HV=2, or
AB_deactivation_HV=6, and crash signal lines for disconnecting the high-voltage battery 210 are activated.

The following is carried out in the exemplary embodiment after the signal AB_deactivation_HV=1 has been received:

1. The high-voltage coordinator 100 starts a timer for the self-diagnosis. In other words, only a certain time is provided for the self-diagnosis. The device 100, that is to say the high-voltage coordinator, is designed to provide an intended period for the fault analysis and to disconnect the high-voltage components 200 if the fault analysis has not been concluded by the expiry of the predefined period.

2. The high-voltage battery 210, triggered by the high-voltage coordinator 100, starts an insulation resistance measurement. Following a measurement, the signal is qualified and is transmitted to the high-voltage coordinator 100 using CAN.

3. The air-conditioning operating part, likewise triggered by the device 100, activates the high-voltage heating system 260 and transmits the voltage status of the high-voltage heating system 260 and of the electrical air-conditioning condenser 250 to the high-voltage coordinator 100.

4. After expiry of the timer which may be adjustable and is assumed to be 3 seconds in the present case, the device 100 links the status of the high-voltage interlock, the status of insulation faults, the voltage status of the high-voltage heating system 360, the status of the electrical air-conditioning condenser 250, the status of the charging device 230 and the internal status to one another. The timeout of all of the signals is additionally monitored. In the event of a fault, the high-voltage system is irreversibly deactivated and actively discharged. A red lamp with the corresponding text is indicated in the combination instrument 290.

In the event of a crash with a low crash severity, the signal AB_deactivation_HV=1 is transmitted and a check is carried out to determine whether the terminal 15 (ignition plus) was active for a particular time. In this case, a flag, that is to say a memory mark, is set in the event of the crash. If the time expires, the mark is deleted since the self-diagnosis was completed. If the terminal 15 is deactivated within this time, the check is carried out the next time. The signal AB_deactivation_HV=1 is transmitted on the CAN again for approximately 10 seconds in the event of an ignition change.

The following is carried out after the signal AB_deactivation_HV=6 has been received and the crash signal line has been activated:

1. The high-voltage battery 210 irreversibly deactivates the actuation of the high-voltage contactor and transmits the emergency disconnection to the high-voltage coordinator 100.

2. The high-voltage coordinator 100 deactivates the high-voltage system and requests the active discharge.

3. The power electronics 220 start an active discharge, for example by means of signaling from the airbag control device 240 and the high-voltage coordinator 100.

In other words, if the signal indicating a minor accident is received, a timer is started and monitored in the device 100. In the event of faults, the deactivation and emergency discharge of the high-voltage components 200 are requested. Irreversible deactivation is carried out internally and a corresponding fault memory entry is made. In addition, the red warning lamp is actuated. In the high-voltage battery 210, the insulation measurement is triggered (actuated/initiated) and transmission of the status of the insulation faults and of the high-voltage interlock is requested. The power electronics 220 are checked for their operational readiness. The charging device 230 provides a status relating to the corresponding non-live status. The air-conditioning control device 270 actuates the high-voltage heating system 260 and the electrical air-conditioning condenser 250 and then transmits their voltage status.

In the event of a major accident, the device 100 requests the deactivation of the high-voltage battery 210 and emergency discharge of the high-voltage capacitors. The high-voltage battery 210 is irreversibly deactivated and makes a corresponding fault memory entry. In addition, the corresponding warning lamp is actuated. The power electronics 220 are reversibly deactivated and actively discharge the high-voltage capacitors. A corresponding fault memory entry is made. The charging manager 230 is likewise deactivated and a corresponding fault memory entry is made. The air-conditioning control device 270 may accordingly actuate the high-voltage heating system 260 and the electrical air-conditioning condenser 250 again. Following deactivation of the high-voltage system on account of a crash, the airbag warning lamp is actuated in the combination instrument 290.

In the event of a fault in the airbag control device, an airbag warning lamp is on in the combination instrument 290. The high-voltage system can then be operated. If the airbag control device 240 transmits incorrect values, for example AB_deactivation_HV≠1, 2 or 3, the system does not react thereto. In other exemplary embodiments, the system can then also carry out disconnection for reasons of safety.

Figure 3:
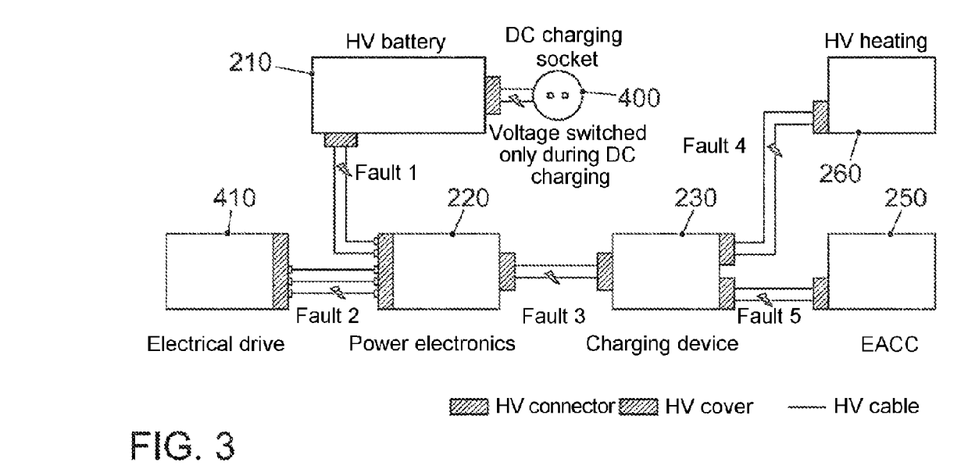
FIG. 3 shows an overview of the faults which may occur as a result of a line interruption in a high-voltage system in an exemplary embodiment.

FIG. 3 illustrates an overview of the faults which may occur as a result of a line interruption or break. FIG. 3 shows the high-voltage battery 210 which is coupled to a DC bearing bushing 400. The high-voltage battery 210 is also coupled to the power electronics 220 which are in turn coupled to an electrical drive 410. The power electronics 220 are also coupled to the charging device 230 which operates the electrical air-conditioning compressor 250 and the high-voltage heating system 260. Faults which are labeled faults 1 to 5 in FIG. 3 may occur at the respective interfaces. A function of the fault analysis may be detection of open high-voltage lines. This function, that is to say the detection of open high-voltage lines, can be triggered after a crash event. The aim is to detect faults 3 to 5 illustrated in FIG. 3. In this case, fault 3 is a fault between the power electronics 220 and the charging device 330. Fault 4 corresponds to a line interruption or break between the charging device 230 and the high-voltage heating system 260. Fault 5 corresponds to a line break or a line interruption between the charging device 230 and the electronic air-conditioning compressor 250.

In other words, fault 1 is not checked in this case by the detection of open high-voltage lines. However, disconnection is carried out in the event of a voltage fault in the power electronics 220. Fault 2 is likewise not checked by the detection of the open high-voltage line in this case. It is possible to detect a break only if the electrical machine 410 is actuated and the expected current is not reached. Fault 3 can be determined by the charging device 230 by measuring an undervoltage. The high-voltage heating system 260 is previously actuated by the air-conditioning operating part 270 for a short time so that the capacitors of the charging device 230 are discharged. If the component is severely damaged, a timeout is detected. Fault 4 is detected by an undervoltage of the high-voltage heating system 260 since the required current is not reached. The voltage can be calculated using the current value. If the component is severely damaged, a timeout is detected. Fault 5 can be detected by the electrical air-conditioning compressor 250 which determines an undervoltage by measuring the voltage.

A discharge is carried out by an internal resistor. If the component is severely damaged, a timeout is detected.

In the exemplary embodiment, the high-voltage contactor of the high-voltage battery 210 can open in a short interval of time of 10-100 ms following the input of the crash signal via hardware lines. The high-voltage contactor of the high-voltage battery 210 can also open in a time of approximately 20-200 ms following the input of the crash signal via CAN in the deactivation stage AB_deactivation_HV=6. If the high-voltage battery 210 detects the crash event via CAN in the deactivation stage AB_deactivation_HV=6 or discrete supply lines from the airbag control device 240, the crash event can be entered in the fault memory of the battery 210 as an irreversible crash.

In the event of a fault memory entry with irreversible disconnection, the closing of the contactor of the high-voltage battery 210 can be prevented until the fault memory is erased, independently of a change of terminal 15 and in an irreversible manner. The entry of an irreversible crash event in the fault memory of the high-voltage battery 210 is not erased here by the change of terminal 15 or by permanently interrupting the terminal 30 (duration+terminal). If the high-voltage battery 210 is deactivated owing to a crash, the signal "BMS_fault_emergency disconnection_crash=6" (cf. FIG. 2) should be signaled using the CAN bus. If the high-voltage battery 210 detects a crash event via CAN in the deactivation stage 6, the signal "BMS_fault lamp_request=1" can be transmitted. If the high-voltage battery 210 detects a crash event via CAN with the deactivation stage "AB_deactivation_HV=1", the insulation resistance measurement can be restarted. If the signal "BMS_fault lamp_request=1" is received, the result of the insulation measurement can be transmitted after being measured once. After the crash signal "AB_deactivation_HV=6" has been received, the active discharge and an active short circuit until the next operating cycle change can be activated in a short time of 10-100 ms, for example by a change of terminal 15. After the crash signal "AB_deactivation_HV=6" has been received, the crash event can be entered in the fault memory. If the power electronics 220 receive the signal "BMS_fault_emergency disconnection_crash", the active discharge and an active short circuit until the next operating cycle change, for example a change of terminal 15, can be activated. The active discharge can also conclude itself, for example when the voltage has fallen below a particular value, for example <60 V.

After the crash signal "AB_deactivation_HV=6" has been received, a request to deactivate the charging device can be transmitted by the charging manager 230 within a short time. After the crash signal "AB_deactivation_HV=6" has been received, the crash event can be entered in the fault memory.

After the crash signal "AB_deactivation_HV=1" has been received, an applicable timer, for example with a guide value=3 s, can be started in the device 100. After the following faults have been received up until the expiry of the timer, the high-voltage system can be irreversibly deactivated, that is to say desired mode change and "MO_fault_emergency discharge_request" (cf. FIG. 2):

1. Insulation resistance fault, "BMS_fault_insulation" in FIG. 2
2. High-voltage interlock fault, "BMS_fault_pilot"
3. Open high-voltage line, that is to say the functional detection of open high-voltage lines as described above:
    3.1 power electronics 220 report the fault "EM_HV_ready for operation" or a timeout
    3.2 voltage at the charging device 230 is undershot, "CHG_status_non-live status" or a timeout
    3.3 undervoltage in the electrical air-conditioning compressor 250, "AC_fault_HV_EACC" or a timeout
    3.4 undervoltage in the high-voltage heating system 260, "AC_fault_HV_EACC" or a timeout.

In the event of irreversible deactivation, the crash event can be entered in the fault memory of the engine control device 100. If the engine control device 100 detects a crash event using CAN crash signals, for example "AB_deactivation_HV=6", a high-voltage disconnection can be signaled to the high-voltage battery 210, the power electronics 220, the charging device 230, the high-voltage heating system 260 and the electrical air-conditioning compressor 250 and the requests for the active discharge can be signaled, for example until terminal 15 changes.

After the crash signal "AB_deactivation_HV=1" has been received, the high-voltage heating system 260 can be activated for 300 ms by the air-conditioning control device 270. The fault signaling by the electrical air-conditioning compressor 250, signal "EACCs_01", can be transmitted with the signal "AC_fault_HV_EACC" according to a value description. The fault signaling by the high-voltage heating system 260 and by the electrical air-conditioning compressor 250 can likewise be transmitted with the signal "AC_fault_HV_heating" according to the value description, cf. signal "HV_Hs_01". After the high-voltage contactor has been activated, the high-voltage heating system 260 can be initialized so that the LIN signal "HV_Hs_01" contains the current status. In exemplary embodiments, this may apply only to high-voltage heating systems 260 without a voltage measurement. After the crash signal "AB_deactivation_HV=6" has been received, the high-voltage heating system 260 can be activated for 1 s with a delay of 1 s. The following is possible as a value description, for example:

0: INIT for initialization even when an LIN message is absent for a short time,
1: no fault detected in the component,
2: fault detected in the component,
3: fault, for example permanent absence of the LIN message, timeout.

After a crash with a low crash severity, "AB_deactivation_HV=1" is transmitted, a flag, that is to say a memory mark, can be set, and the flag can be deleted when the terminal 15 is active for 10 s after a crash or after a change of terminal 15. If the marker or flag is set after a change of terminal 15, the signal "AB_deactivation_HV=1" can be transmitted.

In other words, in the present exemplary embodiment, the device 100 is designed to keep the high-voltage components 200 ready for operation in the event of a minor accident and if the fault analysis reveals a fault-free function of the high-voltage components 200.

The description above relates to the engine control device or the device 100, but exemplary embodiments also provide vehicles which comprise such a device 100 or an engine control device. In other words, a vehicle having a device 100 corresponds to a further exemplary embodiment which has, as high-voltage components, a high-voltage battery 210, an electrical drive 410, one or more high-voltage capacitors, power electronics 220, a charging device 230, a high-voltage heating system 260 and/or a high-voltage air-conditioning compressor 250. The vehicle also comprises an airbag sensor, the device 100 being coupled to the airbag sensor. The vehicle also comprises a high-voltage contactor, the device being coupled to the high-voltage contactor and the high-voltage contactor making it possible to disconnect the high-voltage components 200.

Figure 4:
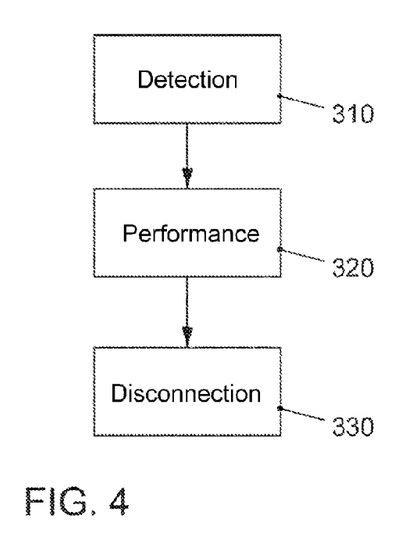
FIG. 4 shows a block diagram of an exemplary embodiment of a method for deactivating high-voltage components.

FIG. 4 shows a block diagram of an exemplary embodiment of a method for deactivating high-voltage components 200 of a vehicle. The method comprises a step of detecting 310 a vibration and a step of carrying out 320 a fault analysis of the high-voltage components 200. The method also comprises a step of disconnecting 330 the high-voltage components 200 if the fault analysis reveals a fault in the high-voltage components 200. In addition, an exemplary embodiment comprises a computer program having a program code for carrying out one of the methods mentioned above if it is executed in the engine control device of a vehicle, for example.

The features disclosed in the above description, the following claims and the accompanying figures may be important and may be implemented both individually and in any desired combination for the purpose of implementing an exemplary embodiment in its various configurations.

Although some aspects have been described in connection with a device, it goes without saying that these aspects are also a description of the corresponding method, with the result that a block or a component of a device should also be understood as meaning a corresponding method step or a feature of a method step. In a similar manner, aspects which have been described in connection with or as a method step are also a description of a corresponding block or detail or feature of a corresponding device.

Depending on the particular implementation requirements, exemplary embodiments may be implemented using hardware or software. Implementation may be carried out using a digital storage medium, for example a floppy disk, a DVD, a Blu-ray disc, a CD, a ROM, a PROM, an EPROM, an EEPROM or a flash memory, a hard disk or another magnetic or optical memory which stores electronically readable control signals which may interact or interact with a programmable hardware component in such a manner that the respective method is carried out.

A programmable hardware component may be formed by a processor, a computer processor (CPU=Central Processing Unit), a graphics processor (GPU=Graphics Processing Unit), a computer, a computer system, an application-specific integrated circuit (ASIC), an integrated circuit (IC), a system-on-chip (SoC), a programmable logic element or a field programmable gate array (FPGA) with a microprocessor.

The digital storage medium may therefore be machine-readable or computer-readable. Some exemplary embodiments therefore comprise a data storage medium having electronically readable control signals which are able to interact with a programmable computer system or a programmable hardware component in such a manner that one of the methods described herein is carried out. At least one exemplary embodiment is therefore a data storage medium (or a digital storage medium or a computer-readable medium) on which the program for carrying out at least one of the methods described herein is recorded.

Exemplary embodiments can generally be implemented as a program, firmware, a computer program or a computer program product with a program code or as data, the program code or the data being effective so as to carry out at least one of the methods when the program runs on a processor or a programmable hardware component. The program code or the data may also be stored, for example, on a machine-readable carrier or data storage medium. The program code or the data may be in the form, inter alia, of source code, machine code or byte code and another intermediate code.

Another exemplary embodiment is also a data stream, a signal sequence or a sequence of signals representing the program for carrying out at least one of the methods described herein. The data stream, the signal sequence or the sequence of signals can be configured, for example, so as to be transferred via a data communication connection, for example via the Internet or another network. Exemplary embodiments are therefore also signal sequences which represent data and are suitable for transmission via a network or a data communication connection, the data representing the program.

A program according to at least one exemplary embodiment may implement at least one of the methods during its execution, for example, by reading memory locations or writing a data item or a plurality of data items to the memory locations, as a result of which switching operations or other operations are possibly caused in transistor structures, in amplifier structures or in other electrical, optical or magnetic components or components operating according to another functional principle. Accordingly, data, values, sensor values or other information can be acquired, determined or measured by a program by reading a memory location. A program can therefore acquire, determine or measure variables, values, measurement variables and other information by reading one or more memory locations and can effect, cause or carry out an action and can actuate other devices, machines and components by writing to one or more memory locations.

The exemplary embodiments described above are only an illustration of the principles. It goes without saying that modifications and variations of the arrangements and details described herein will be apparent to other experts. Therefore, the intention is to be restricted only by the scope of protection of the following patent claims and not by the specific details presented herein using the description and the explanation of the exemplary embodiments.

It is known from conventional technology that vehicles have considerable amounts of energy. In the field of internal combustion engines, measures are therefore provided which prevent fuel from escaping from the fuel tank and being ignited in the event of an accident, for example. Similar problems also arise in hybrid vehicles or electric vehicles. Although no fuel can escape from a fuel tank in this case, the batteries used there are nevertheless a potential hazard in the event of accidents.

So-called high-voltage systems (HV) which can operate with operating voltages of 50 to 500 volts, for example, are used in hybrid and electric vehicles. In this respect, a significant hazard may emerge in the event of contact with such a voltage, in particular in the event of an accident. For this reason, efforts which attempt to disconnect such a high-voltage system in the event of an accident are also known in the field of conventional technology. The document DE 10 2004 057 828 A1 describes an emergency disconnection of electrical circuits in a motor vehicle. In this case, in a first stage, the power and set-up circuits of the vehicle are disconnected, a generator is de-energized and an emergency power supply for the circuits associated with drive train operation is ensured. In a second stage, the emergency power supply for drive train operation is disconnected again.

If the high-voltage components of the drive train are damaged in an accident, the switching-on of an emergency power supply for the drive train may likewise be associated with hazards. In addition to hazards produced by touching or coming into contact with the voltages of the high-voltage system, there are also hazards based, for example, on short circuits which may be caused by the components being destroyed or deformed in an accident. This may occasionally cause a considerable fire hazard.

There is therefore a need for an improved concept for deactivating high-voltage components of a vehicle.

The invention claimed is:

1. A device for deactivating high-voltage components of a vehicle, wherein the device carries out a fault analysis of the high-voltage components following the detection of a vibration and disconnects the high-voltage components in response to the fault analysis revealing a fault in the high-voltage components, wherein the device distinguishes a minor accident from a major accident based on the detection of the vibration is detected, and
    wherein the device irreversibly disconnects the high-voltage components from a vehicle network without a fault analysis in the event of a major accident, carries out the fault analysis in the event of a minor accident, and disconnects the high-voltage components only after the fault analysis reveals a fault in the high-voltage components,
    wherein the device initiates a self-diagnosis of one or more of the high-voltage components as part of the fault analysis, initiates an interlock check, detects a line interruption, initiates an insulation resistance measurement, and determines a voltage status of a high-voltage heating system and/or of an electronic air-conditioning compressor.

2. The device of claim 1, wherein the device initiates an active discharge of high-voltage capacitors in the event of irreversible disconnection.

3. The device of claim 1, wherein the device reversibly disconnects the high-voltage components in the event of a minor accident and if the fault analysis reveals a fault in the high-voltage components.

4. The device of claim 1, wherein the device detects the vibration using an airbag sensor.

5. The device of claim 1, wherein the device provides a predefined period for the fault analysis and disconnects the high-voltage components if the fault analysis has not been concluded by the expiry of the predefined period.

6. A vehicle having an engine control device for deactivating high-voltage components of a vehicle, wherein the engine control device carries out a fault analysis of the high-voltage components following the detection of a vibration, wherein the engine control device distinguishes a minor accident from a major accident based on the detection of the vibration is detected; and
    wherein the engine control device irreversibly disconnects the high-voltage components from a vehicle network without a fault analysis when a major accident has been determined, carries out the fault analysis when a minor accident has been determined, and disconnects the high-voltage components from a vehicle network only when the carried out fault analysis reveals a fault in the high-voltage components,
    wherein the engine control device initiates a self-diagnosis of one or more of the high-voltage components as part of the fault analysis, initiates an interlock check, detects a line interruption, and initiates an insulation resistance measurement.

7. The vehicle of claim 6, having high-voltage components comprising:
    a high-voltage battery;
    an electrical drive;
    power electronics;
    one or more high-voltage capacitors;
    a charging device;
    a high-voltage heating system; and/or
    a high-voltage air-conditioning compressor.

8. The vehicle of claim 6, further comprising an airbag sensor coupled to the engine control device.

9. The vehicle of claim 6, further comprising a high-voltage contactor wherein the engine control device is coupled to the high-voltage contactor, the high-voltage contactor configured to disconnect the high-voltage components.

10. A method for deactivating high-voltage components of a vehicle, the method comprising:
    detecting a vibration via a sensor and distinguishing between a minor and major accident based on the detected vibration;
    performing a fault analysis of the high-voltage components in response to the vibration detection and a minor accident has been determined;
    disconnecting the high-voltage components without a fault analysis when a major accident has been determined and disconnecting the high-voltage components from a vehicle network only when the fault analysis reveals a fault in the high-voltage components and a minor accident has been determined; and
    keeping the high-voltage components ready for operation when a minor accident has been determined and when the fault analysis reveals a fault-free function of the high-voltage components; and
    initiating a self-diagnosis of one or more of the high-voltage components as part of the fault analysis, initiates an interlock check, detects a line interruption, initiates an insulation resistance measurement, and determines a voltage status of a high-voltage heating system and/or of an electronic air-conditioning compressor.

11. A non-transitory computer program product having a program code for carrying out a method for deactivating high-voltage components of a vehicle, the method comprising:
    detecting a vibration and distinguishing between a minor and major accident based on the detected vibration;
    performing a fault analysis of the high-voltage components in response to the vibration detection and a minor accident has been determined;
    irreversibly disconnecting the high-voltage components without a fault analysis when a major accident has been determined; and reversibly disconnecting the high-voltage components when the fault analysis reveals a fault in the high-voltage components and a minor accident has been determined, and
    wherein the device initiates a self-diagnosis of one or more of the high-voltage components as part of the fault analysis, initiates an interlock check, detects a line interruption, initiates an insulation resistance measurement, and determines a voltage status of a high-voltage heating system and/or of an electronic air-conditioning compressor, wherein the program code is executed on a computer, a processor or a programmable hardware component.

* * * * *